United States Patent [19]
Fong

[11] Patent Number: 5,537,358
[45] Date of Patent: Jul. 16, 1996

US005537358A

[54] FLASH MEMORY HAVING ADAPTIVE SENSING AND METHOD

[75] Inventor: Vincent L. Fong, Cuppertino, Calif.

[73] Assignee: National Semiconductor Corporation, Santa Clara, Calif.

[21] Appl. No.: 349,787

[22] Filed: Dec. 6, 1994

[51] Int. Cl.⁶ .................................................. G11C 13/00
[52] U.S. Cl. ................ 365/218; 365/185.33; 365/185.29
[58] Field of Search ..................................... 365/218, 900, 365/185.29, 185.33

[56] References Cited

U.S. PATENT DOCUMENTS 5,400,287   3/1995   Fuchigami ............................... 365/900
5,414,664   3/1995   Lin et al. ................................ 365/900

Primary Examiner—Terrell W. Fears
Attorney, Agent, or Firm—Limbach & Limbach

[57] ABSTRACT

A flash memory system including an array of flash memory cells and at least one programmed reference cell and at least one erased reference cell disposed in a common integrated circuit. Memory array read operations are carried out by reading the two reference cells and the target cell of the memory array. The two reference cells produce a programmed reference output and an erased reference output which are averaged to provide a reference value to be compared with the read output of the target cell. In that the reference value is derived by on-chip programmed and erased cells, the reference value will automatically adapt to changes in the fabrication process, temperature, operating voltages and the like. Preferably, the reference cell outputs are also utilized to adaptively control the programming and erasing of the memory array cells so as to control the erased and programmed threshold voltages of the array cells.

18 Claims, 9 Drawing Sheets

5,537,358

1

FLASH MEMORY HAVING ADAPTIVE SENSING AND METHOD

BACKGROUND OF THE INVENTION

1. Field of the Invention

The present invention relates generally to flash memories and in particular to flash memories having adaptive circuitry for controlling programming, reading and erasing operations.

2. Background Art

FIG. 1A shows a simplified typical conventional flash memory cell, generally designated by the numeral 10. Cell 10 is formed in an N type substrate 12. A P type well 13 is formed in substrate 12 followed by the formation of an N+ type region 16 in the well which functions as the source and another N+ type region which functions as the drain. The region 14a in the well 14 intermediate the source 16 and drain 18 region functions as the cell channel region.

A polysilicon floating gate 20 is disposed over the channel region 14a and is insulated from the channel region by a thin gate oxide 22. A polysilicon control gate 24 is disposed over the floating gate 20 and is insulated from the floating gate by an interpoly dielectric layer 26.

FIG. 1A also illustrates typical voltages which can be applied to cell 10 in order to program the cell. A relatively large positive voltage Vpp, +12 volts for example, is applied to the control gate 24. An intermediate voltage, +6 volts for example, is applied to the drain region 18 and the source region 16 is grounded. The P well 18 is biased to ground level by way of a P+ contact 28.

The large positive voltage applied to the control gate 24 causes hot electrons to be injected from the source region 16 towards the drain region 18. The electrons pass through the gate oxide 22 in that portion of the channel region 42a near the drain region 18 and into the floating gate 20. As will be explained later, the presence of the negative charge on the floating gate alters the threshold voltage of the cell thereby indicating that the cell has been programmed. Cell 10 will remain programmed until it is erased as depicted in FIG. 1B. Although the predominate mechanism for the programming mechanism is hot electron injection, other mechanisms also occur.

Referring to FIG. 1B, this figure shows typical voltages for erasing cell 10. The source region 16 and the drain region 18 are left open (floating) and an intermediate positive voltage, +3 volts for example, is applied to the P-well 14. A relatively large negative voltage Vee, typically −15 volts, is applied to the floating gate 24. These voltages cause electrons to be transferred from the floating gate 20 and through the thin gate oxide 22 and into the positive P-well along the channel 42a. The predominate mechanism for erasing in the manner previously described is commonly referred to as cold electron injection or Fowler-Nordheim tunneling. In the case of a flash memory array, all cells are usually erased in bulk, that is, individual cells are not erased. For more recent memory architectures, it is possible to erase the memory on a row by row basis.

FIG. 1C depicts the manner in which cell 10 is read. The drain region 18 is connected to an intermediate level positive voltage, such as +3 volts, by way of a load impedance represented by resistors 30A and 30B. The resistors divide down the +3 volts to approximately +1.5 volts at the drain region 18. An intermediate positive voltage, such as +3 volts, is applied to the control electrode 24 and the source region 16 is grounded.

2

In the event the cell 10 has not been previously programmed, the cell will have an erased threshold voltage VtErase which is relatively low. The voltage applied to the cell will be sufficient to invert the channel 14a, that is, to render the cell 10 conductive. A current will be drawn through load 30A/30B and will produce a voltage at the inverting input of a sense amplifier 32, also connected to the drain region 18, which is less than the +1.5 volts present when the cell is non-conductive at of a reference voltage VRef. The output of the sense amplifier will change state thereby indicating that the cell had not been programmed but, rather, was in the erased state.

In the event cell 10 had been previously programmed, the negative charge present on the floating gate 20 due to the presence of electrons will increase the threshold voltage of the cell. The increased threshold voltage, referred to as VtWrite, will prevent the cell 10 from becoming conductive when the voltages of FIG. 1C are applied. Thus, the voltage applied to the inverting input of amplifier 32 will remain high at +1.5 volts. Reference voltage Vref is selected to be less than +1.5 volts so the amplifier output will remain unchanged indicating that the cell had been programmed.

Cell 10 is programmed by applying the programming voltages for some period of time in the form of a programming pulse. FIG. 2 is a graph indicating programming time (in terms of microseconds) versus programmed threshold voltage VtWrite. Curves 34a and 34b represent the distribution of threshold voltage VtWrite among a population of cells for a given program pulse width. It can be seen from these curves that there is a fairly wide distribution of threshold voltages VtWrite for short programming pulses with the two curves 34a and 34b converging at a higher voltage when the pulse width is on the order of a 100 microseconds or more.

FIG. 3 is a graph showing the distribution of erase threshold voltages VtErase versus time in terms of milliseconds. Curves 36a and 36b represent the distribution of erase threshold voltages VtErase for a population of cells. As can be seen, the distribution becomes somewhat smaller and the absolute voltage less as the duration of the erase pulse increases.

FIG. 4 is a further graph, with the horizontal axis representing the threshold voltage Vt and the vertical axis representing the number of cells in a memory array expressed in terms of Bytes. Curve 38a depicts the distribution of erase threshold voltages VtErase for a population of erased cells in a particular memory array. All threshold voltages fall between a minimum value VtE1 and a maximum value VtE2, with the majority of cells falling approximately midrange between the two.

Curve 38b of FIG. 4 depicts the distribution of write (program) threshold voltage VtWrite for a population of programmed cells. All threshold voltages fall between a minimum value VtW1 and a maximum value VtW2, with the majority of cells falling approximately midrange between the two values.

Curve 40 of FIG. 4 represents the reference voltage VSense which is related to reference voltage VRef (FIG. 1C) which is used to sense whether a cell has been programmed during a read operation. Ideally, the entire population of all cells in an array has a single fixed threshold voltage VtErase and a single fixed threshold voltage VtWrite which is greater than VtErase by some fixed magnitude so that the programmed state of the cells can be reliably ascertained. Further, in order to increase the speed of cell read operations, ideally this difference in threshold voltage magnitude is relatively small so that the time required to sense the state of a cell is reduced. Such reduction comes about due to the fact that inherent time constants in the cell sensing circuitry result in read delays which can be reduced provided the magnitude of the voltage swings required for sensing are reduced.

Notwithstanding the foregoing, it can be seen from the curves of FIGS. 2, 3 and 4 that the average value of threshold voltages VtErase and VtWrite vary as does the distribution of the population of cells around these average values. This is due primarily to large process variations and wide operating conditions. These factors interfere with reliable memory operation. For example, if a single cell in an array has a threshold voltage VtErase that has been reduced to 0 volts, that is, VtE1 is 0 volts or less, the cell will remain conductive even in the absence of a read voltage being applied to the control gate. This condition will interfere with the proper operation of the entire array. Similarly, if a single cell has a threshold voltage VtErase which exceeds the sense voltage Vsense, that is, VtE2 is on the other side of curve 40 (FIG. 4), the cell will be improperly interpreted as a programmed cell during a read operation.

The above-noted problems become much more severe in low voltage applications such as +3 volt battery operation. In that event, the distribution curve 38a must be even more precisely controlled, as compared with +5 volt operation, since Vsense will typically be only approximately +5 volts.

The present invention overcomes the above-described shortcomings of conventional flash memories. The disclosed memory permits the threshold voltages VtErase and VtWrite be adaptively controlled to compensate for process variations and wide changes in operating conditions. In addition, the reference voltage VRef can be adaptively adjusted to compensate these variations and conditions. These and other advantages of the present invention will become apparent to those skilled in the art upon a review of the following Detailed Description of the Invention together with the drawings.

SUMMARY OF THE INVENTION

A flash memory system is disclosed which includes a memory array of flash memory cells, a programmed-cell reference which includes a multiplicity of flash memory cells and an erased-cell reference which also includes a multiplicity of flash memory cells. The system is initialized by programming the cells of the programmed-cell reference and erasing the cells of the erased-cell reference using standard program and erase conditions. Preferably, the cells of the memory array, the programmed-cell reference and the erased-cell reference are arranged in rows and columns, with the cells of the two references being disposed in separate columns. In that event, the columns that form the actual memory array are preferably disposed intermediate the two reference columns.

The subject memory system includes a control means for programming, easing and reading the cells of the memory array. Reading is preferably accomplished by reading an erased flash cell located in the erased-cell reference and a programmed flash cell located in the programmed-cell reference so as to produce an erased reference output and a programmed reference output, respectively. Preferably, the two reference cells are located in the same system array row in which the selected memory array cell to be read is located.

The two reference outputs are then used for reading the selected cell of the array. Typically, the two outputs are averaged so as to provide a reference output which is compared to the output of the memory cell being read. Thus, the reference output is adaptively altered to take into account process variations, temperature changes, changes in supply voltages and the like. In addition, the two reference outputs can be used in programming and erasing the memory array cells so as to compensate for cells which are "weak" and "strong".

DETAILED DESCRIPTION OF THE INVENTION

Figure 5:
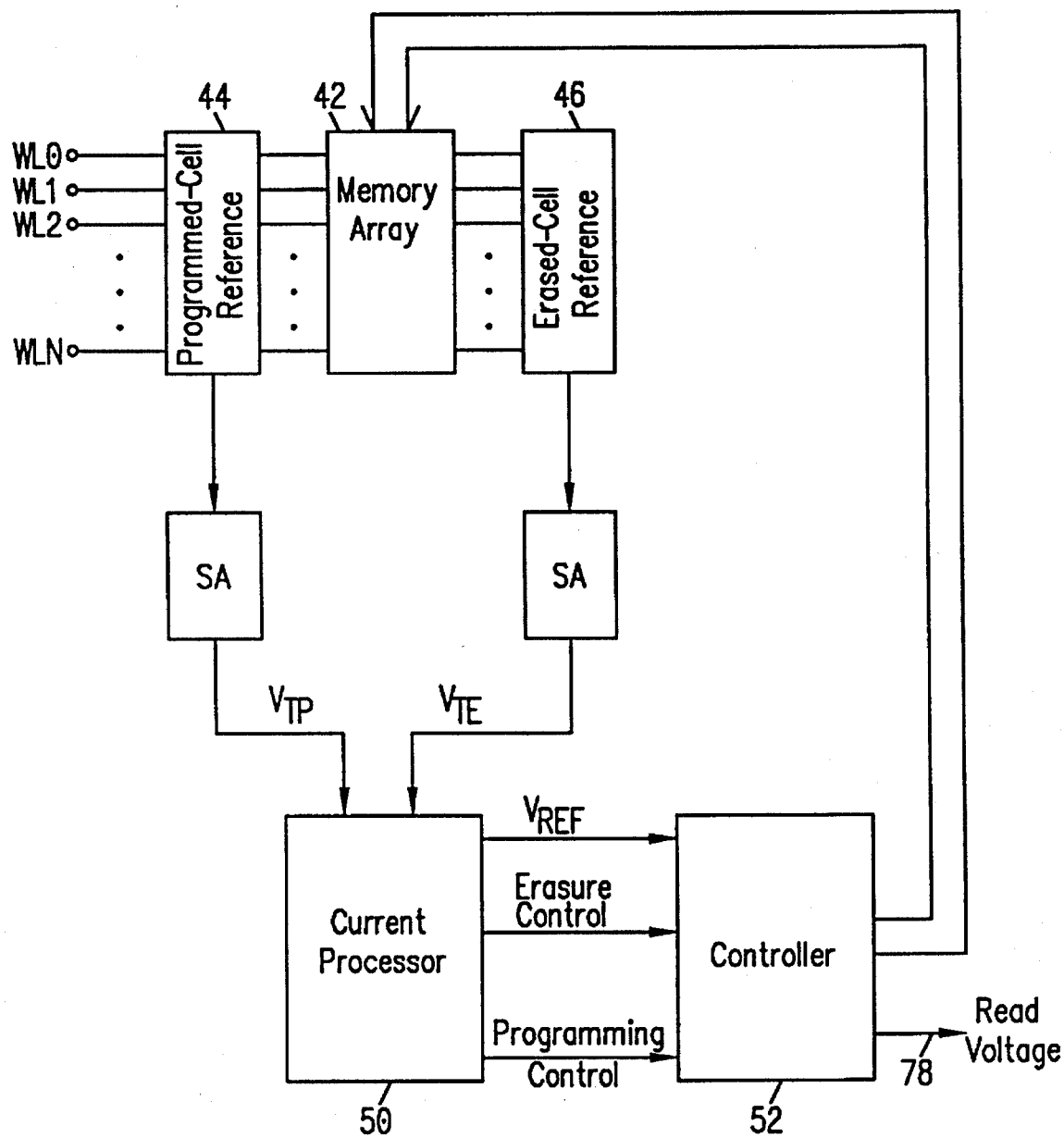
FIG. 5 is a simplified block diagram of a flash memory system array in accordance with the present invention.

Referring again to the drawings, FIG. 5 shows an overall block diagram of a memory system in accordance with the present invention. The memory system includes a memory array 42 comprising an array of flash memory cells arranged in horizontal rows and vertical columns. A typical array may have 1024 columns and 2024 rows. Two columns 44 and 46 of flash memory cells 10a and 10b are configured to function as reference columns. These two columns extend along the full length of the memory array 42 and are spaced on opposite sides of the array. One column functions as the Programmed-Cell Reference column 44 and the other column functions as the Erased-Cell Reference column 46.

As will be explained in greater detail, the memory system includes a Controller 52 which performs various functions including the decoding of memory addresses and the generation of the appropriate voltages for performing such memory operations as reading, programming and erasing. Most of the details concerning the construction and operation of Controller 52 are conventional and will not be described except as they relate to the subject invention.

Figure 6:
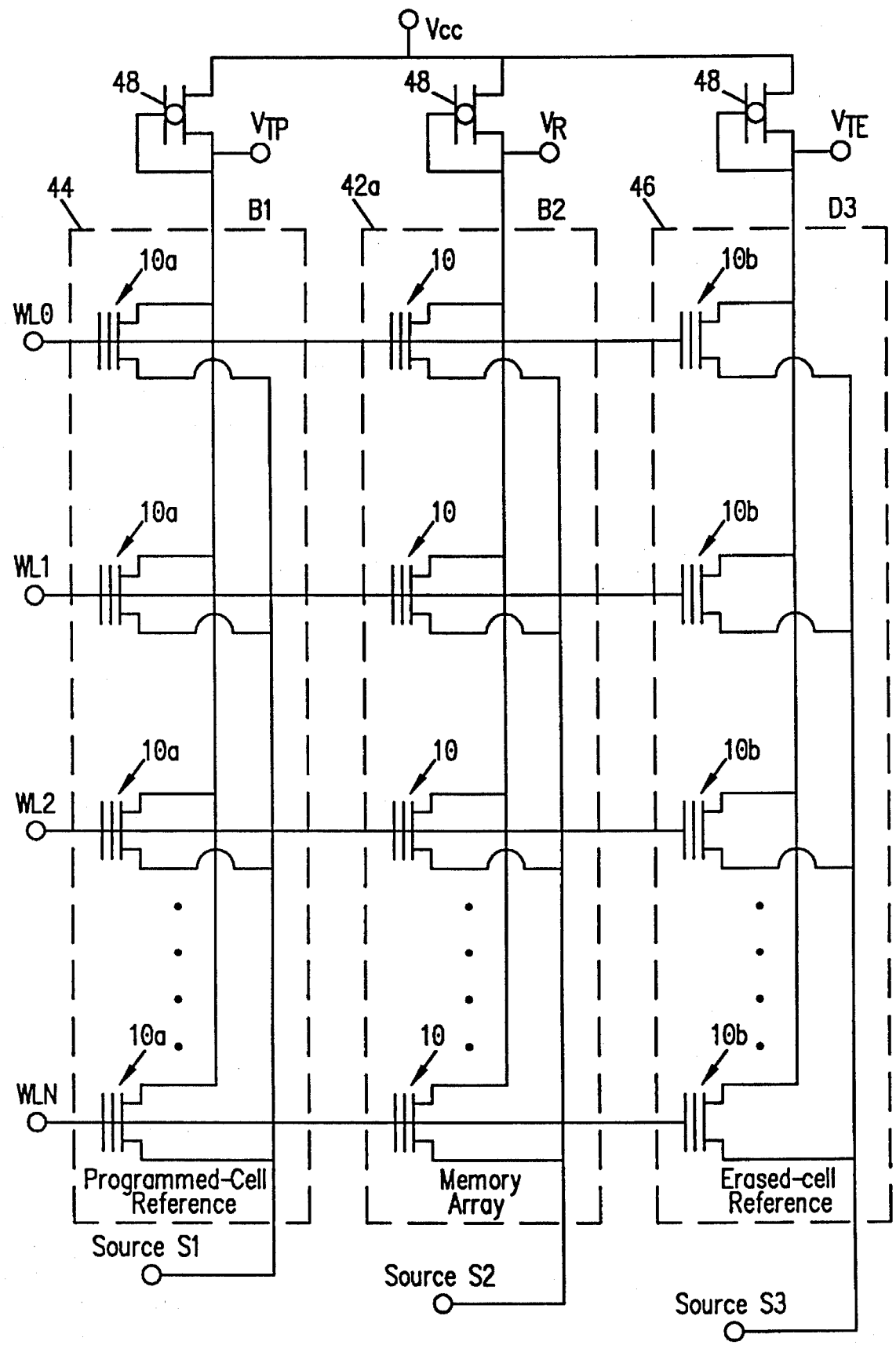
FIG. 6 is a diagram of a column of flash memory cells with function as programmed cell references, a column of flash memory cells which function as erased cell references and an exemplary column of cells of the flash memory array.

FIG. 6 shows further details of the programmed-cell reference column 44, the erased-cell column 46 and an exemplary column 42a of the memory array 42. Each of the three columns is shown to include four cells 10. The source regions of all the cells in a column are connected in common to a source line. Programmed-Cell Reference column 44 utilizes common source line S1, exemplary array column 42a utilizes common source line S2 and Erased-Cell Reference column 46 utilizes common source line S3.

The drain regions of all the cells in a particular column are connected to a common bit line. The drains of cells 10a in Programmed-Cell Reference column 44 are connected to common bit line B1, the drains of the cells 10 of exemplary column 42a are connected to the common bit line B2 and the drains of the cells 10b of Erased-Cell Reference column 46 are connected to common bit line B3.

The control electrodes of all of the cells 10, 10a and 10b in a particular row are connected together to form a common word line. For example, the first three rows of the cells 10a, 10 and 10b of columns 44, 42a and 46, respectively, utilize respective common word lines WL0, WL1 and WL3. The last row N of cells utilize word line WLN.

As previously noted, the control circuitry for applying appropriate voltages for programming, erasing and reading the cells is not described as it is conventional. During a read operation, a load in the form of a P channel FET 48 is connected between the supply voltage Vcc and each of the bit lines BN. Loads 48 perform a function equivalent to resistors 30A/30B of FIG. 1C. The FET 48 will produce gate-source voltages Vtp, Vr and Vte related to the current flow through the associated columns 44, 42a and 46, respectively.

In operation, it is first necessary to initialize the Programmed Cell Reference column 44 and the Erased Cell Reference column 46. This initialization usually need only be performed once in the life of the memory, with the cells 10a and 10b of the two reference columns 44 and 46 not being programmed or erased during any subsequent memory operations performed on the memory cells 10.

Figure 1A:
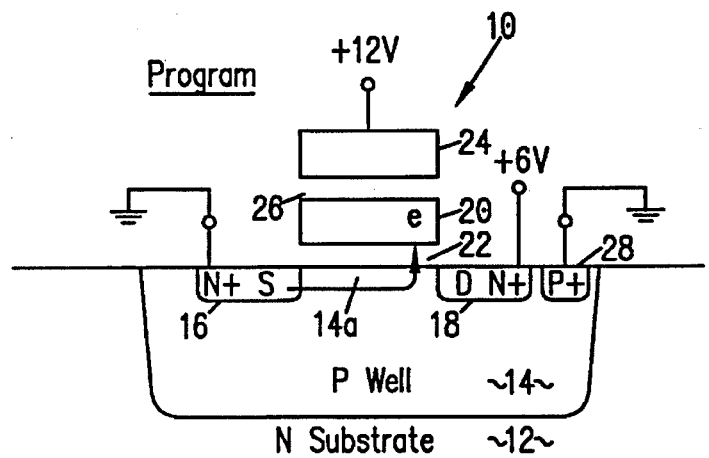
FIG. 1A is a diagram of a conventional flash memory cell showing the application of exemplary voltages used for programming the cell.
Figure 1B:
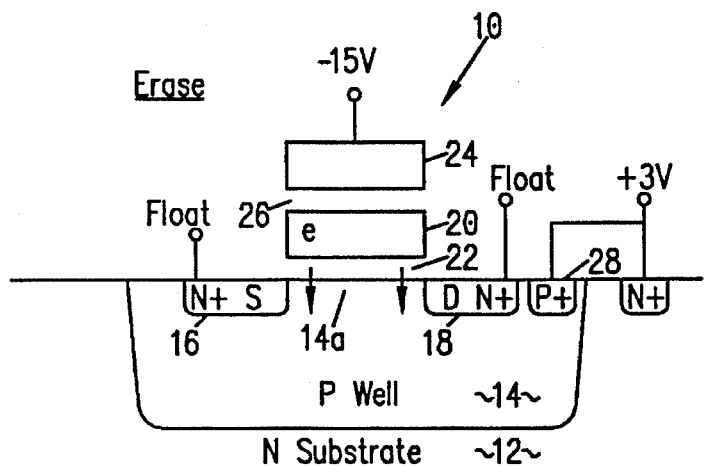
FIG. 1B is a diagram of a conventional flash memory cell showing the application of exemplary voltages used for erasing the cell.

In the initialization, all of the cells 10a of the Programmed-Cell Reference column 44 are first programmed using a reference programming sequence. By way of example, the voltages set forth in connection with FIG. 1A are applied for a duration of 100 microseconds. Second, the cells 10b of the Erased Cell Reference column 46 are erased using a reference erasing sequence. By way of further example, the voltages set forth in connection with FIG. 1B are applied for a duration of 500 milliseconds.

Once the two reference columns 44 and 48 have been initialized the memory system is ready for operation. Assume, for example, that the cells 10 of the array 42 are to be erased. Co-pending application Ser. No. 08/348,812 entitled "APPARATUS AND METHOD FOR REDUCING ERASED THRESHOLD VOLTAGE DISTRIBUTION IN FLASH MEMORY ARRAYS" discloses an apparatus and method for reducing the distribution of the erased threshold voltages of the memory cells so that the threshold voltages are caused to fall within a relatively narrow predetermined voltage range. In this co-pending application, the contents of which are hereby incorporated by reference, circuitry is disclosed for accurately determining whether any cells have been erased below a target minimum threshold voltage and for softly programming the cells to increase the erased threshold voltage.

Figure 10:
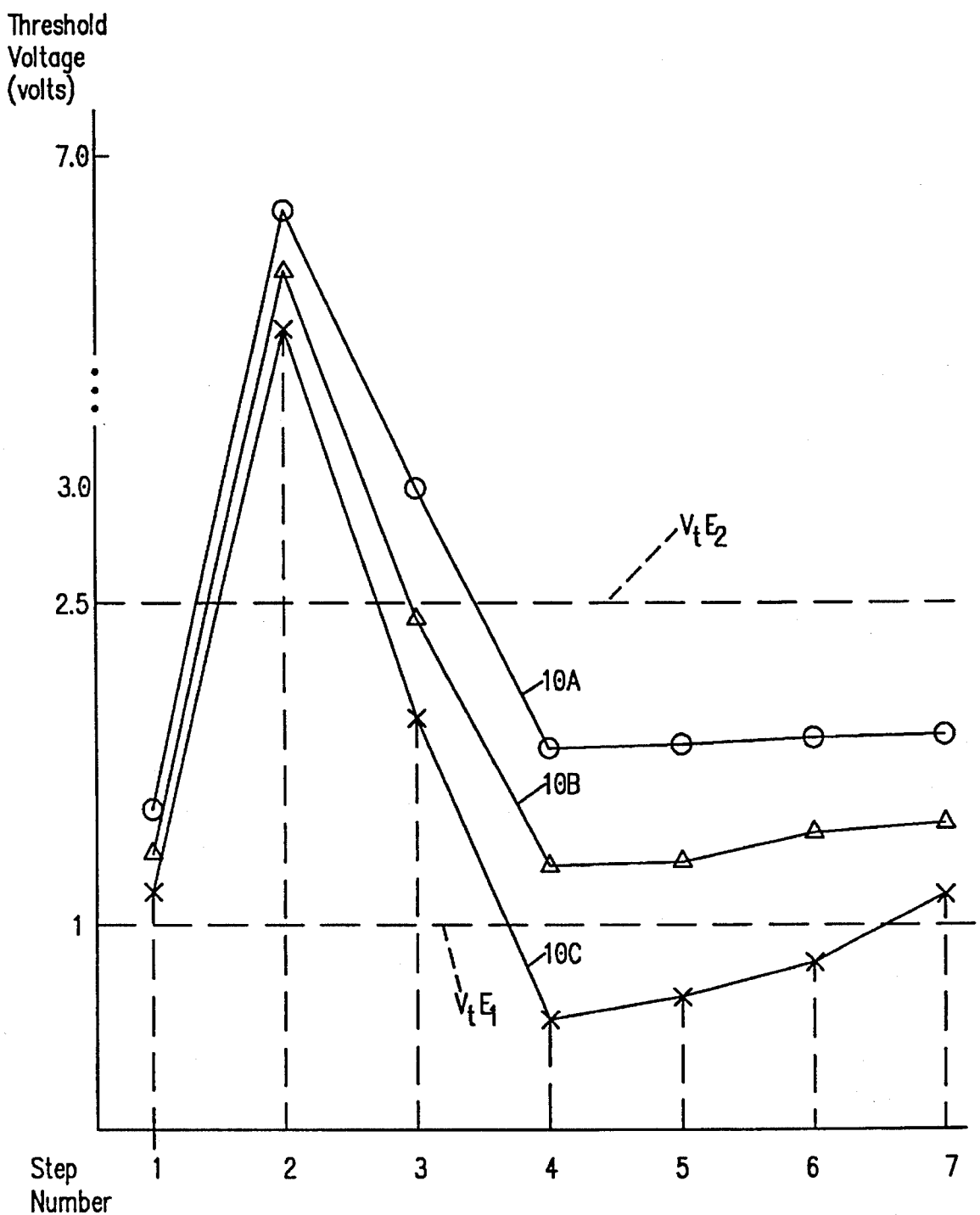
FIG. 10 is a graph illustrating the threshold voltages for exemplary memory cells during the preferred erase sequence in accordance with the subject invention.
Figure 11:
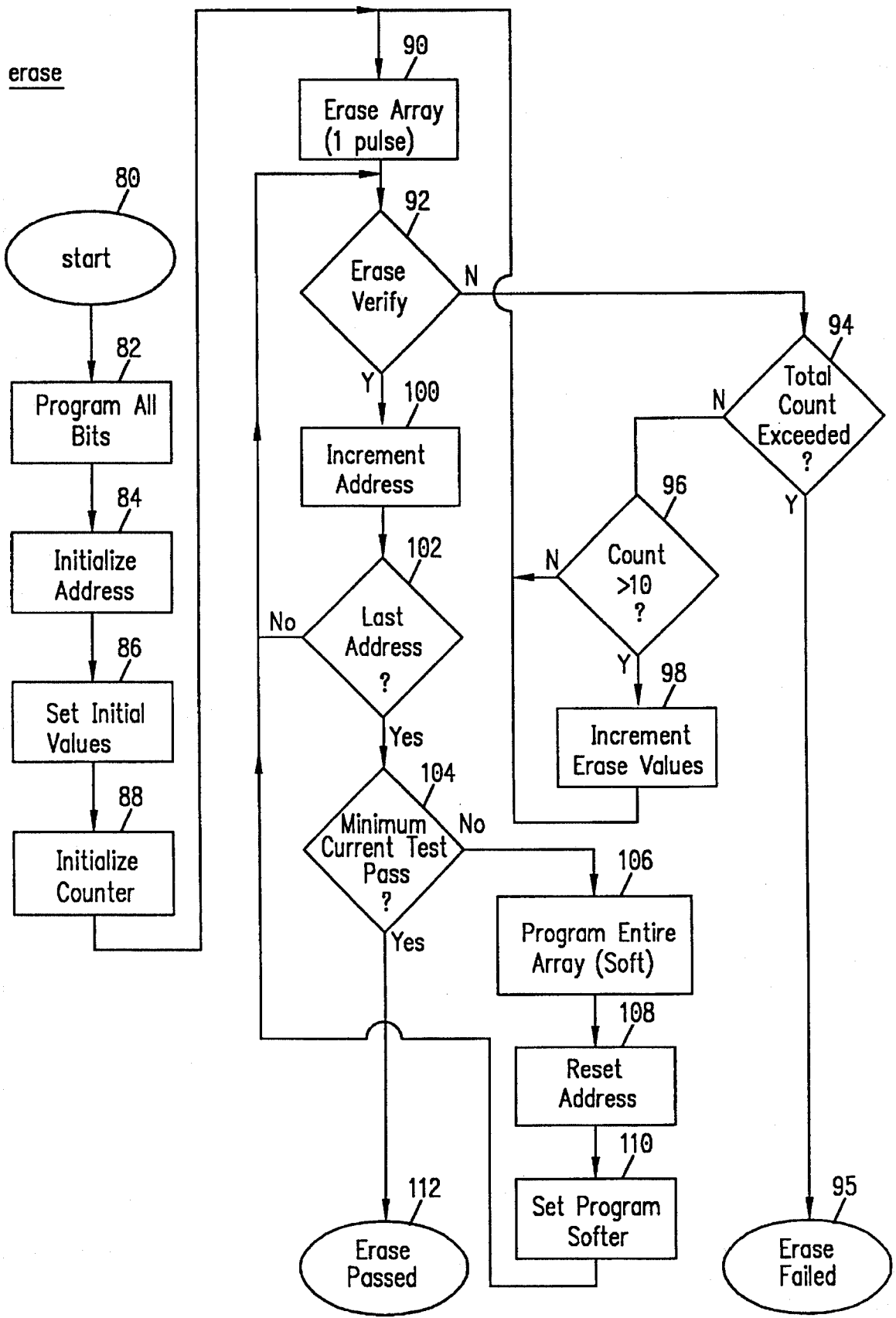
FIG. 11 is a flow chart depicting the preferred erasing sequence to be used in carrying out the subject invention.

FIG. 11 is a flow chart illustrating the control steps taken out under the control of the Controller 52. The flow chart will be described in connection with the graph of FIG. 10 which shows the threshold voltages for three exemplary cells 10A, 10B and 10C of a typical FIG. 5 array 42. The vertical axis of the graph represents the threshold voltage of the cells and the horizontal axis represents the particular step in the process that results in the threshold voltage. The term threshold voltage is used here to mean the gate-source voltage applied to the cell which results in a cell current of one micro-ampere.

As explained in the above-noted pending application, it is desirable to erase the cells 10 in a controlled manner such that all of the cells of the array 42 have an erased threshold voltage VtErase that fall between a predetermined minimum VtE1 target and a predetermined maximum VtE2 target. In the present example, the minimum target is +1 volt and the maximum target is +2.5 volts, such values being typical for a primary supply voltage of +3 volts.

The array 42 is initialized, typically at the manufacturing facility, so that the array is effectively in a completely erased state. This is a conventional step which, in the present example, results in threshold voltages ranging from +1 to +2 volts. The graph of FIG. 10, at Step 1, shows the threshold voltage for exemplary cells 10A, 10B and 10C which fall within this range. Note that there is a distribution of threshold voltages for the three examples even in this step of the sequence.

As indicated by block 82 of FIG. 11, the erase sequence includes the initial programming of the entire array thereby increasing the threshold voltage of the cells. The programming can be carried out utilizing voltages such as shown in FIG. 1A. The duration of the +12 volt program pulse applied to the drain and control gate is typically 100 microseconds. As can be seen in FIG. 10, Step 2, the cells are all programmed to a relatively high state of approximately +6 volts. Again, it can also be seen that there is a distribution of about 1 volt for the three exemplary cells at this stage of the sequence.

The next step of the erase sequence is to commence the erasure of either a selected row of the array or the entire array 42, depending on how the array is actually implemented, by applying a single erase pulse to all of the cells to be erased and then measuring the threshold voltage of the cells. The erase sequence will be described assuming that the entire array is to be erased, but those of ordinary skill would recognize that the sequence would also be applicable to the erasure of cells on a row by row basis.

The erase sequence begins by first resetting a memory cell address register to the first address of the array 42 (block 84 of FIG. 11). In addition, the initial values to be used in the first portion of the erase sequence are set (block 86). Typically, initial erase pulse voltage Vee is −13 volts and the initial pulse width is 50 milliseconds. As indicated by block 88, an internal counter is also initialized at this point for the purpose of keeping track of the number of erase pulses used in the erase sequence.

A single erase pulse is then applied to the cells of the array as indicated by block 90. The erase pulse will cause the threshold voltage of the cells to decrease a fraction of a volt.

Typically, a total of about twenty-five erase pulses will be required for the desired level of erase. Once a single erase pulse has been applied, the first cell of the array, i.e., the cell associated with the first address, is tested to determine whether the cell threshold voltage has dropped below the target maximum VtE2 of +2.5 volts. This Erase Verify step, as indicated by element 92 of FIG. 11, is similar to a cell reading sequence.

Although the Erase Verify test is carried out on a single cell, it can be carried out on a group of cells depending upon the actual architecture of the memory system. For example, if the minimum addressable number of cells is eight (a byte), then it would be satisfactory to Erase Verify that number of cells. The above-noted co-pending application discloses additional details regarding the Erase Verify test, including details regarding the construction of exemplary circuitry for carrying out the test.

Since only a single erase pulse has been applied at this step, the selected cell 10 will almost certainly not have been erased sufficiently to cause the threshold voltage to drop below the target of +2.5 volts. Accordingly, the first cell will have failed the Erase Verify test. A determination is then made as to whether a predetermined maximum number of erase pulses have been applied to the cell 10 being erased (element 94). If the number, typically 1024, has been exceeded, an anomaly has occurred and the erase sequence is terminated (element 95)

Assuming that the maximum number has not been exceeded, a determination is then made as to whether the magnitude of the erase pulse voltage should be increased (element 96). Typically, a total of 10 erase pulses are applied to the array before the magnitude is changed, assuming that the pulses previously applied were insufficient to erase the cell to the desired target of +2.5 volts or below. It is preferable to begin the erase sequence with relatively low magnitude erase pulses so as to reduce the stress to the cells which results from repeated memory program/erase operations (memory cycling). Once a cell has been subjected to a certain number of low magnitude erase pulses, the cells are less subject to the adverse effects of memory cycling. Accordingly, once low magnitude erase pulses have been applied, it is then possible to increase the magnitude of the erase pulse voltage. This functions to minimize the amount of time required to accomplish the erase sequence without subjecting the memory array to undue stress.

Assuming that less than 10 pulses have been applied, a further erase pulse is applied to all of the cells 10 as indicated by blocks 96 and 90. This sequence will continue until the first cell addressed has either been erased to the desired level or until a total of 10 pulses have been applied to the array. As will be explained, once 10 pulses have been applied and the first addressed cell have not yet been erased down to a sufficiently low voltage to pass the Erase Verify test (element 92), then the magnitude of the initial erase pulse voltage (−13 volts) will be increased as indicated by element 98. The manner in which the magnitude of the increase is selected forms an important aspect of the present invention.

As previously noted, the array can be erased in bulk or only a selected row depending on the actual implementation of the array. The characteristics of the cells 10 can be determined, to a large extent, from the programmed threshold voltage Vtp and the erased threshold voltage Vte of the reference cells 10a and 10b located in the same row containing the cells 10 to be erased. If the entire array is to be erased, the threshold voltages Vtp and Vte of any one or the reference cells 10a, 10b are also indicative, albeit to a lesser extent, of the characteristics of the cells 10 or the array.

By way of example, assume that erasure is done on a row by row basis and the row associated with word line WL0 is to be erased. Cell 10a of the Programmed Cell Reference column 44 is read by applying appropriate read voltages thereby generating a voltage Vtp at the gate-drain of FET 48 which is related to the current through the cell 10a. Voltage Vtp is coupled to the Current Processor 50. Similarly, the cell 10b of the Erased Cell Reference column 46 associated with word line WL0 is also read so as to produce a voltage Vte. The voltage Vte is also coupled to the Current Processor 50.

The values of Vtp and Vte of the reference cells are indicative of the characteristics of the cells 10 in the memory array 42 in the row associated word line WL0. Variations in the absolute value of Vte is indicative of variations in the memory cells 10 attributable to process differences. Such process differences result, for example, in variations in the thickeners of the gate oxide 22 (FIG. 1B) and variations in the geometry of the cells. If the value of Vte is low, this is an indication that memory cells 10 in the corresponding row would be more responsive to an erase pulse of a given magnitude than would the cells 10 had the value of Vte been high.

Variations in the difference between the values of Vte and Vtp of the reference cells are indicative of what is sometimes referred to as the strength of the cell in the associated row. A large difference indicates the cells in the row are relatively "strong" and require less energy to become programmed and erased. A small difference is indicative of a "weak" cell which requires more energy to become programmed and erased. Variations of cell strength are largely attributable to the amount of charge trapped on the floating gate 24 which can vary as the cells experience multiple erase/program cycles.

Figure 9:
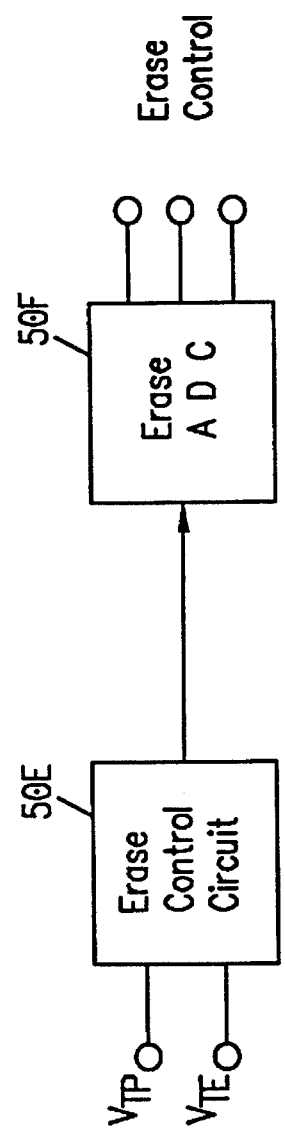
FIG. 9 is a simplified diagram of part of the current processor used in adaptively controlling the erasing of cells.

As previously noted, the values of Vtp and Vte of the reference cells are coupled to the Current Processor 50 (FIG. 5) and are used to select optimum erase pulse parameters. As can be seen from the simplified diagram of FIG. 9, the Current Processor includes an Erase Control circuit 50E having an output connected to an Erase Analog to Digital Converter (ADC) 50F which provides three digital Erase Control output signals having eight possible combinations. These output signals are used to access a look-up table for controlling the erase pulse characteristics based upon the absolute value of Vte and the difference between Vte and Vtp.

An exemplary look-up table for use in controlling the erase pulse characteristics is set forth in Table 1 below. Table 1 shows the corresponding increase to be made to the initial erase pulse magnitude for each of the eight possible combinations of digital outputs for Erase Control signals generated by Erase ADC 50F.

TABLE I

| Vtp (volts) | Vte (volts) | ERASE (ΔV/Time) |
|---|---|---|
| 6.5 | 1.0 | 0.3 |
| 5.5 | 1.0 | 0.4 |
| 6.5 | 1.5 | 0.4 |
| 5.5 | 1.5 | 0.5 |
| 6.5 | 2.0 | 0.5 |
| 5.5 | 2.0 | 0.6 |
| 6.5 | 2.5 | 0.6 |
| 5.5 | 2.5 | 0.7 |

The first column of Table 1 indicates the various possible values for the Vtp of the particular reference cell 10a located in the same row of the cells 10 being erased. The second column indicates the various possible values for the Vte of the reference cells 10b located in the same row of the cells being erased. The third column of Table 1 represents the magnitude by which the erase pulse voltage Vee is to be increased above the initial value which, as previously noted, is −13 volts.

As the magnitude of the erase pulse voltage Vee is increased, it is preferable to decrease the duration of the pulse width. Table 2, below, shows the preferred duration of the erase pulses for given ranges of erase pulse magnitudes.

TABLE 2

| Vee (volts) | PULSE DURATION (milliseconds) |
|---|---|
| −13.0 to −13.5 | 50 |
| −13.5 to −14.0 | 25 |
| −14.0 and higher | 10 |

It can be seen from Table 1 that the increase in erase pulse magnitude is larger for larger values of Vte and for larger values in the difference in Vte and Vtp. The values set forth in Table 1 are intended to be exemplary only and can be changed by those skilled in the art so as to optimize the erase sequence so that the cells are all erased to a threshold voltage VtE which falls within a desired predetermined narrow range of values, as will be explained, within a minimal amount of time.

Returning to the FIG. 11 flow chart, the 10 initial erase pulses (−13 volts for 50 milliseconds) will almost never be sufficient to successfully erase the first cell subjected to the Erase Verify test (element 92) so that it will be necessary to increase the magnitude of the erase pulse voltage Vee (element 98) in accordance with Table 1 and to perhaps decrease the duration of the pulse in accordance with Table 2. Assuming, for example, that the programmed referenced cell 10a located in the row being erased has a erased threshold Vtp of 6.5 volts and the erased reference cell 10b has a erased threshold Vte of 1.5 volts, Table 1 indicates that the magnitude of Vee will be increased to −13.4 volts. Table 2 indicates that the duration of the erase pulse will remain 50 milliseconds. If, after ten additional pulses have been applied at −13.4 volts and the cell being tested still continues to fail the Erase Verify test, the voltage will be increased by another 0.4 volts to −13.8 volts. Table 2 indicates that the pulse duration will be decreased to 25 milliseconds.

This sequence will continue until the first addressed cell passes the Erase Verify test or, if an anomaly has occurred, until the maximum total number of pulses have been applied (element 94). The first address cell will eventually pass the Erase Verification test in which case the memory address will be incremented to the next address as indicated by block 100. A determination will then be made as to whether all of the memory addresses have been tested, as indicated by element 102. Since that is not the case, the sequence will return to the Erase Verify test (element 92) at which time the second address cell of the array will be tested. At this point in the erase sequence, it is likely that some of the cells 10 will be below the target maximum threshold voltage VtE2 as indicated as Step 3 of the FIG. 10 graph. As can be seen, both cells 10B and 10C are below the maximum value, but cell 10A remains above this value.

Returning to the FIG. 11 flow chart, assuming that the second cell did not pass the Erase Verification test (exemplary cell 10A would not at this stage), and assuming that less than 10 pulses have been applied (element 96), the sequence will return to block 90 and the selected row to be erased (or entire array) will be subjected to a single erase pulse using the same erase pulse magnitude used with the previous erase. The second cell is again subjected to the Erase Verify test. Assuming that it eventually passes the test, the address will be incremented (block 100) and the third cell will be tested. This sequence will continue until either all cells pass the Erase Verify test or until some predetermined maximum erase pulses have been used. As previously explained, if the maximum number has been exceeded, a failure has occurred and the sequence will terminate (element 95).

Referring again to FIG. 10, Step 4 shows typical threshold voltages of the three exemplary cells 10A, 10B and 10C at this stage of the erase sequence. It can be seen that the threshold voltage of all three cells has dropped below the target maximum VtE2 value of +2.5 volts. Since each cell of the array is subjected to the same erase pulses required to reduce the threshold voltage to below the target of +2.5 volts, the cells with the lowest initial programmed threshold voltage at Step 2 will tend the have the lowest erased threshold voltage after erase. By way of example, at Step 4 it can be seen that the threshold voltage of cell 10C will have a threshold voltage of about +0.5 volts, lower than the target minimum erased threshold voltage VtE1 of +1 volt and lower than the other exemplary cells 10A and 10B.

As can also be seen from FIG. 10, Steps 2 to 4, the distribution of the threshold voltages widens as the cells are erased. This is due primarily to the fact that the difference in programmed threshold voltages at Step 2 is attributable to a difference in the number of electrons present on the respective floating gates of the cells 10. When the cells are erased, the actual potential applied to the floating gates is dependent, in part, on the floating gate charge. Those cells having a larger charge after programming, such as cell 10A, will respond more readily to the negative erase voltage Vee and will manifest a greater rate of decrease in threshold voltage for a given erase pulse than do cells having a smaller floating gate charge in the programmed state, such as cell 10C. Thus, as can be seen from FIG. 11, the dispersion between the threshold voltages actually increases as the cells are erased. It is a principal object of the invention described in the above-note co-pending application to decrease this erased threshold voltage dispersion.

When all of the cells of the array have passed the Erase Verification test (element 92 of FIG. 11), a determination is made as to whether any of the erased cells have an erased threshold voltage which is less than the target minimum erased threshold voltage VtE1. The minimum value is +1 volt in the present example. This is accomplished by way of a Minimum Current test, indicated by element 104.

As explained in the above-noted co-pending application, the Minimum Current test is accomplished by applying a voltage equal to the target maximum VtE1, +1 volts, to all of the word lines WLN of the array and applying a predetermined positive voltage to all of the bit lines BLN connected to the drains of the cells. In the event any one or more cells 10 in the entire array has been erased to a threshold voltage of less than +1 volt, such cells will become conductive and a minimum leakage current of one microamp per cell will flow through the array. Circuitry for detection of such minimum leakage current is disclosed in the co-pending application.

If the Minimum Current test is passed, the array has been successfully erased, with all of the cells 10 falling between the target maximum erased threshold voltage VtE2 and the target minimum erased threshold voltage target VtE1. The erase sequence is then concluded as indicated by element 112. In most cases, however, the first Minimum Current test will fail. The state of the exemplary cells 10A, 10B and 10C at Step 4 of the FIG. 10 graph indicates that at least cell 10C has been erased to a threshold voltage of less than the VtE1 value of +1 volts. In that event, a soft program pulse will be applied to the entire array as indicated by block 106. It is important that the erase mechanism be Fowler-Nordheim tunneling (cold electron injection) as opposed to hot electron injection as described in connection with FIG. 1A. Such soft program pulse includes the application of +15 volts to all of the word lines WLN of the array which are connected to the control gates 24 of the cells. In addition, the bit lines BLN connected to the drains of the cells are all grounded. The duration of the soft programming pulse is typically 100 milliseconds.

As can be seen at Step 5 of the FIG. 10 graph, the soft programming pulse will increase the threshold voltage for all of the cells of the typical array, including the three exemplary cells 10A, 10B and 10C. Once the single soft programming pulse is applied, it is necessary to confirm that none of the threshold voltages have been increased to more than the target maximum erased threshold voltage VtE2 of +2.5 volts. This is done by resetting the cell addresses to zero as indicated by block 108. In addition, the strength of any additional programming pulses is reduced as indicated by block 110 in the event such pulses are to be applied. By decreasing the strength of the subsequent programming pulses, there is a reduced likelihood that the programming pulses will cause the threshold voltage of any of the cells 10 to overshoot the target maximum VtE2 value.

The Erase Verify test (element 92) will be conducted on each cell on a cell-by-cell basis starting with the first cell address to confirm that the target maximum threshold voltage VtE2 has not been exceeded. Assuming that all cells pass the test, the Minimum Current test (element 92) will again be conducted on all cells. As can be seen from Step 5, exemplary cell 10C will again fail the test. Accordingly, all cells will be softly programmed by application of an even softer programming pulse. The exemplary cells 10 of FIG. 10 indicate at Step 6 that cell 10C is still below the target minimum erased threshold voltage VtE1 level so that the Minimum Current test will again fail.

This sequence will continue until either all of the cells have been erased/softly programmed to fall between VtE2 and VtE1 or until the number of applied erase pulses exceeds a predetermined number (element 66) such as 1024. It is important to note that the Fowler-Nordheim tunneling mechanism used for the soft programming (block 106) will have a greater influence on those cells having the lowest erased threshold voltage at Step 4. Thus, for example, cell 10C will program more readily than cell 10B and cell 10B will program more readily than cell 10C. This is because the lower threshold voltage cells have fewer electrons present on the floating gate than do the higher threshold voltage cells. Thus, for the same control gate-to-drain voltage, the potential of the electric field across the gate oxide 22 (FIG. 1A) of low threshold voltage cells will be greater than the electric field across the gate oxide 22 of the higher threshold voltage cells. The greater field strength will result in more electrons being attracted to the floating gate of the cell by way of Fowler-Nordheim tunneling than are attracted to the floating gate of the cells having a weaker field strength. Accordingly, the threshold voltage of cell 10C will increase more than that of cell 10B and cell 10B will increase more than that of cell 10A. As the cells are softly programmed, it can be seen from Steps 5, 6 and 7 of FIG. 10 that the threshold voltages tend to converge. Thus, the dispersion of the erased threshold voltage of the cells of the array is reduced. Further, the magnitude and duration of the erase pulses are adaptively adjusted based upon the value Vte and Vtp provided by the reference cells.

Having described the manner in which the array is adaptively erased, the manner in which the array is adaptively programmed will now be described. Referring now to the flow chart of FIG. 12, the program sequence is commenced by setting the initial values of the programming voltage Vpp to be applied to the control gate 24 of the cell to be programmed. In addition, various pulse counters are reset to zero, including a counter for total program pulses applied and another counter for program pulses applied for a given magnitude of Vpp pulses.

Typically, the initial value of Vpp is relatively low and is increased during the programming sequence. By applying an initial low voltage, the cells become conditioned so that subsequent high voltage pulses which are applied in the programming sequence have less tendency to stress the cells thereby increasing the ability of the cells to withstand a large number of program/erase cycle. The initial value of Vpp is typically +11.0 volts and the pulse duration is typically 25 microseconds.

As indicated by block 116 of the flow chart, the initial program pulse is applied to the target cell. Next a determination is made as to whether the target cell has been programmed up to the desired level which, in the present example, is +5 volts. This is determined by a Program Verify test (element 118). Invariably, the cell will not be adequately programmed at this stage of the sequence, so that a determination will be made as to whether the total count, typically 64, has been exceeded. In this case only a single pulse has applied therefor a determination will be made as to whether the count for a particular number of program pulses at a given magnitude of Vpp has been exceeded. The maximum number in the present example is 5, therefore the sequence will return to block 116 which indicates that a further program pulse will be applied at the initial value of Vpp.

Typically, a total of 5 programming pulses at the initial value is not sufficient to adequately program the cell, therefor it will usually be necessary to increase the magnitude of erase pulse voltage Vpp as indicated by block 126. As was the case in the erase sequence, the amount of increase in the magnitude of the erase pulse adaptively selected based upon the measured values of Vte and Vtp of the reference cells 10a and 10b located in the same row as the target cells being programmed.

Table 3 below shows the various amounts that Vpp is to be increased for given values of Vte and Vtp.

TABLE 3

| Vtp (volts) | Vte (volts) | PROGRAM ($\Delta$V/Tiine) |
|---|---|---|
| 6.5 | 1.5 | 0.3 |
| 6.5 | 2.0 | 0.4 |
| 6.0 | 1.5 | 0.4 |
| 6.0 | 2.0 | 0.5 |
| 5.5 | 1.5 | 0.5 |
| 5.5 | 2.0 | 0.6 |
| 5.0 | 1.5 | 0.6 |
| 5.0 | 2.0 | 0.7 |

As the magnitude of voltage Vpp is increased in accordance with Table 3 above, it is desirable to decrease the pulse duration as set forth in Table 4 below.

TABLE 4

| Vpp (volts) | PULSE DURATION (microseconds) |
|---|---|
| +11.0 to +11.5 | 25 |
| +11.5 to +12.0 | 10 |
| +12.0 and higher | 6 |

As can be seen from Table 3 above, the magnitude of the programming voltage Vpp is increased at a greater rate for low values of Vtp, since such low values are indicative that the cell being programmed can be receive a larger programming pulse without being overprogrammed. Similarly, a larger difference between the values Vte and Vtp is indicative of the strength of the cells, with a larger difference indicating that the cell is "strong" and does not require as large a programming pulse as a "weak" cell.

Figure 8:
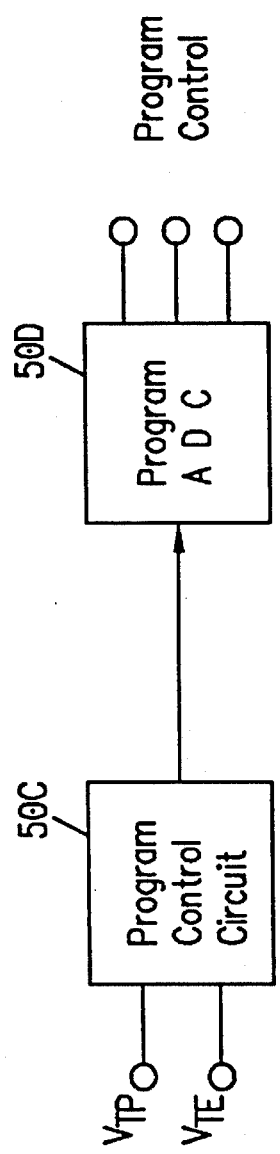
FIG. 8 is a simplified diagram of part of the current processor used in adaptively controlling the programming of cells.

FIG. 8 shows the circuitry of the Current Processor 50, including a Program Control Circuit for producing an analog output indicative of the absolute value of Vtp and the difference in Vte and Vtp. The analog output is connected to an analog to digital converter (ADC) 50F which produces three digital outputs used for selecting the eight possible values that Vpp is to be increased as set forth in Table 3 above.

Figure 12:
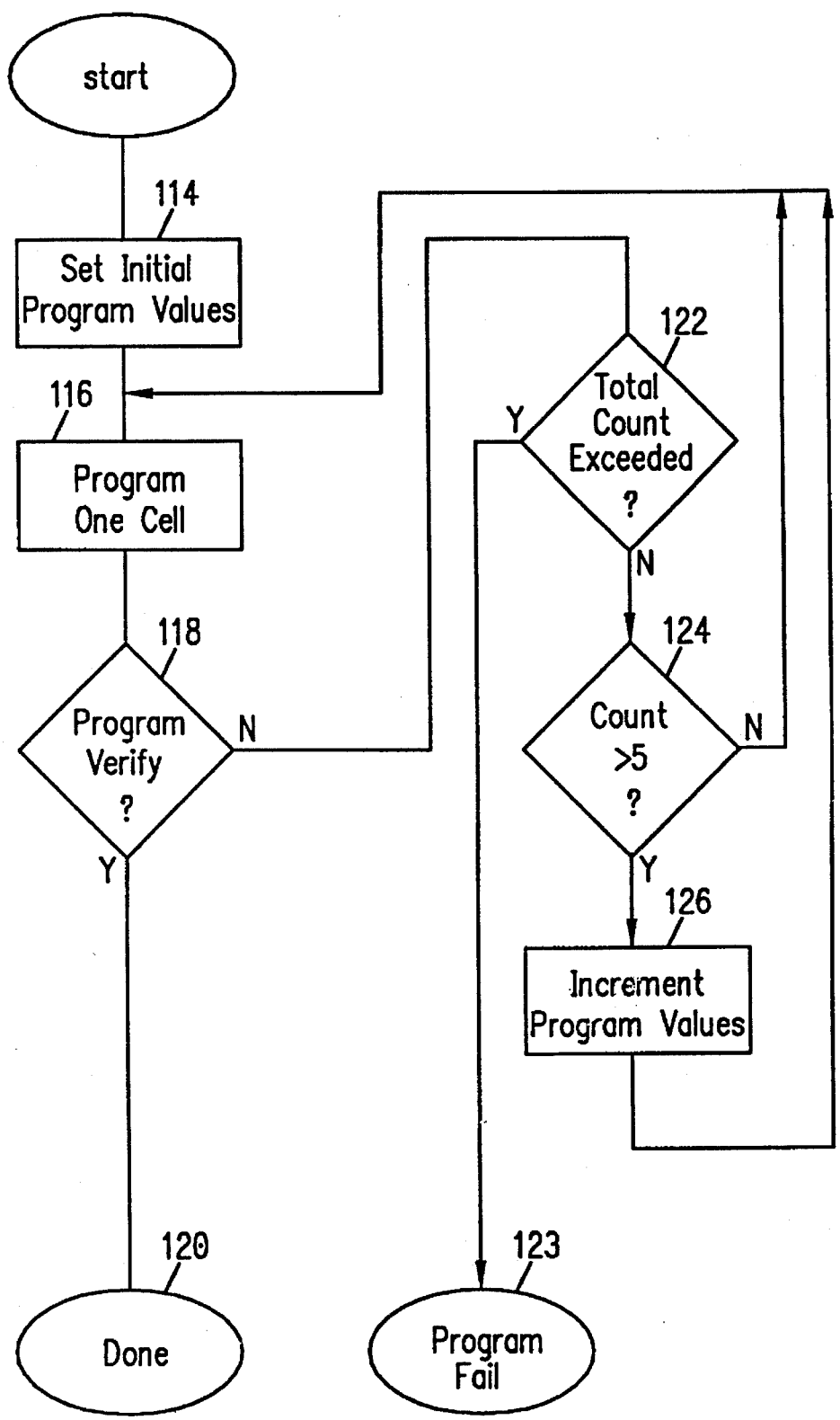
FIG. 12 is a flow chart depicting the preferred programming sequence to be used in carrying out the subject invention.

Returning to the flow chart of FIG. 12, once the value of Vee has been increased (block 126), a further programming pulse is applied to the target cell (block 116). For example, if the original magnitude of Vpp was +11 volts and the values of Vte and Vtp are +5.5 volts and +2.0 volts, Table 3 indicates that Vpp will be increased to +11.6 volts. Table 4 indicates that the duration of the pulse will remain at 25 microseconds. Once the programming pulse has been applied, a determination is made as to whether the cell has been adequately programmed (element 118). If not, a further pulse having a magnitude of +11.6 volts will be applied.

The above sequence will continue, with the magnitude of Vpp increasing every 5 pulses in accordance with Table 3 until either the target cell has been programmed, as determined by the Program Verify test (element 118) of the maximum number of pulses has been applied (64), in which case the programming sequence would have failed.

Figure 1C:
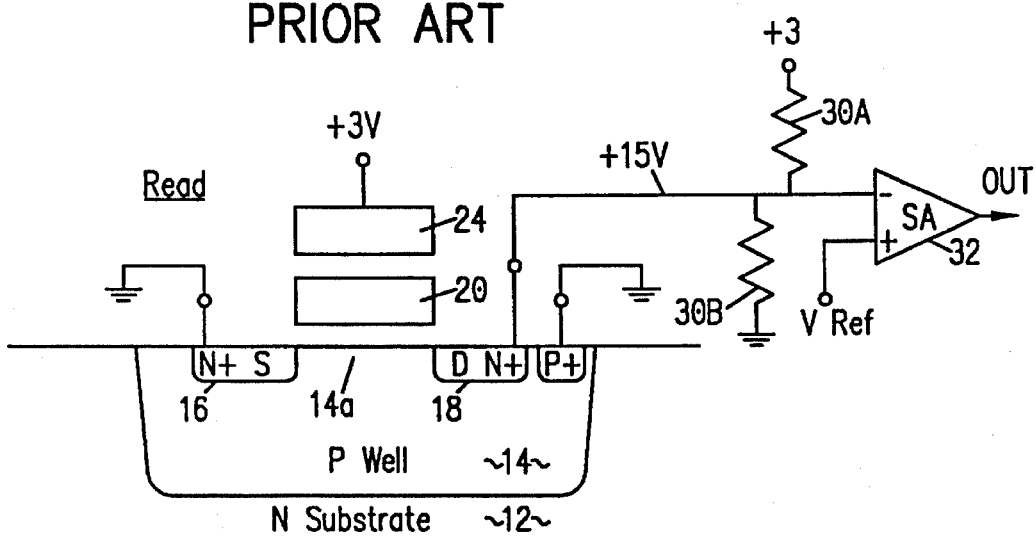
FIG. 1C is a diagram of a conventional flash memory cell showing the application of exemplary voltages used for reading the cell.
Figure 2:
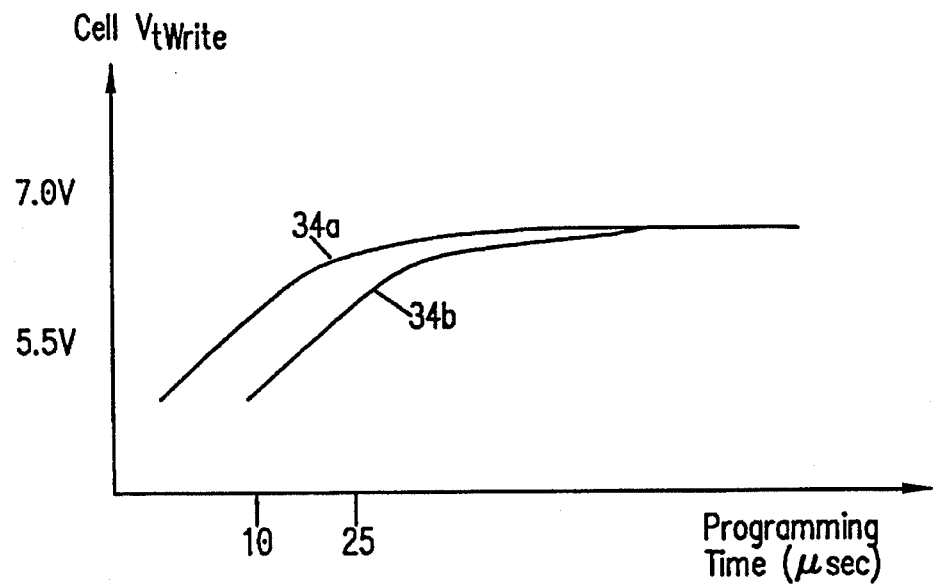
FIG. 2 is a graph showing the distribution of the threshold voltages of programmed flash memory cells versus programming time.
Figure 3:
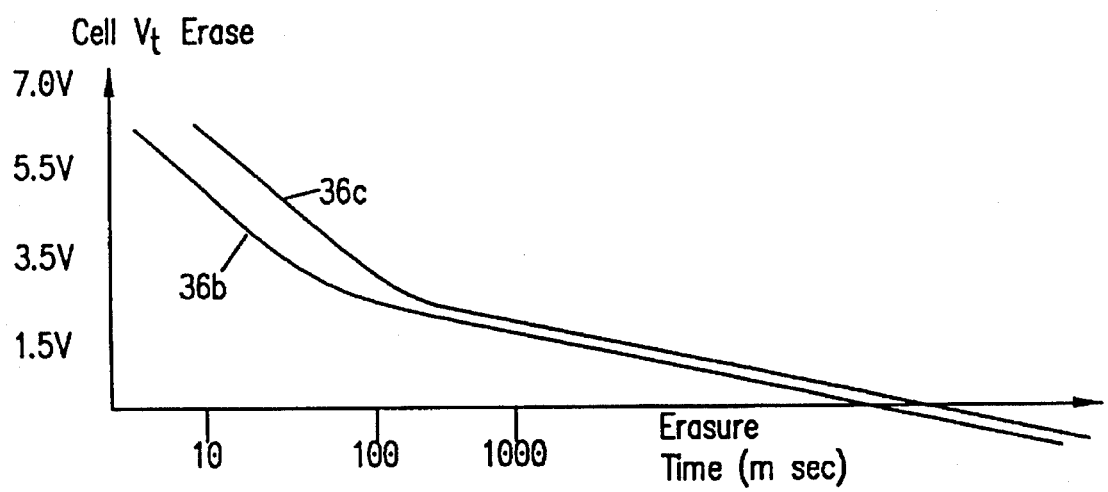
FIG. 3 is a graph showing the distribution of the threshold voltages of erased flash memory cells versus erase time.
Figure 4:
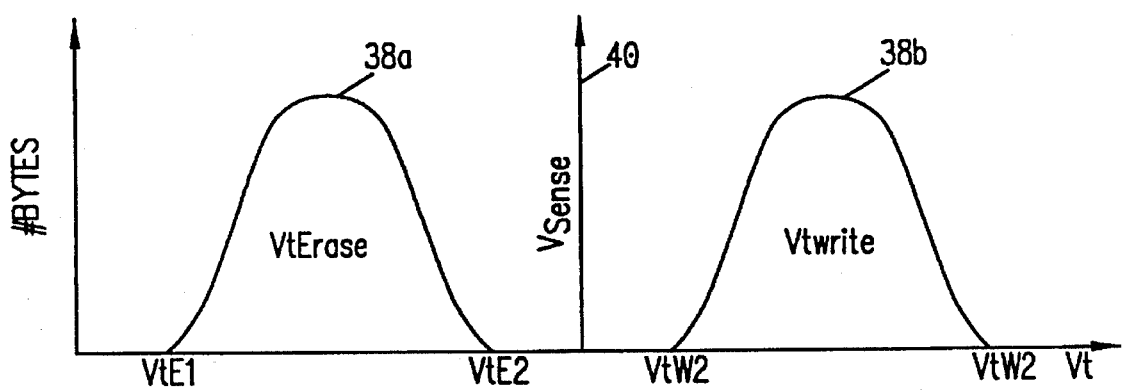
FIG. 4 is a graph showing the distribution of a population of programmed flash memory cells and erased flash memory cells.

Having described the adaptive erase sequence and the adaptive program sequence, the manner in which the cells are adaptively read will now be described. Assume that a memory cell 10 (FIG. 6 in row WL0, is to be read. The voltages to be applied to the associated bit lines and word line WL0 of the target cell 10 are shown in FIG. 1C. Further, the reference cells 10a and 10b located associated with word line WL0 are also read so as to produce values Vtp and Vte. As will be explained, the average of the measured values of Vte and Vtp will be used to produce the reference voltage VRef for reading the target cell.

Figure 7:
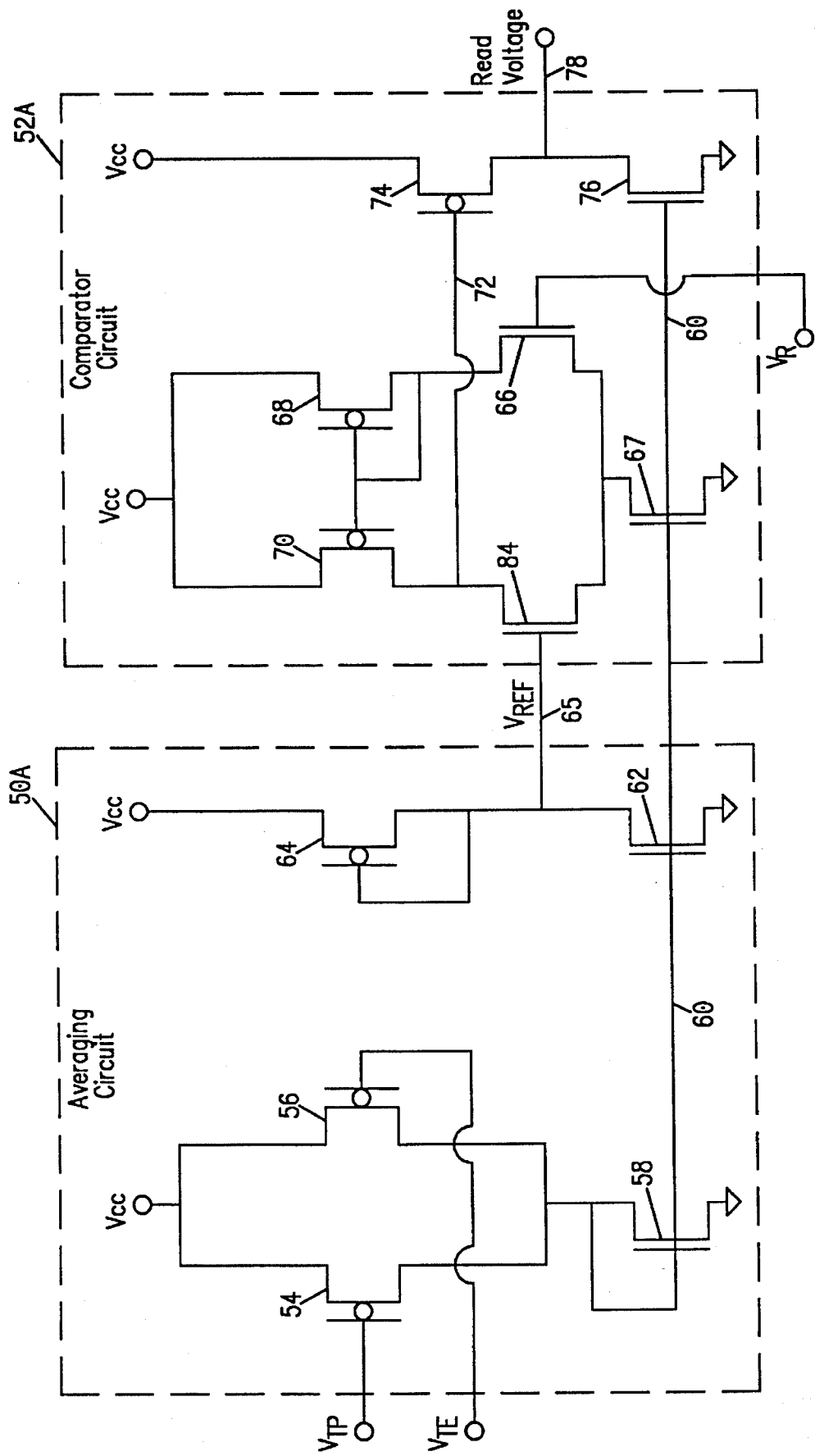
FIG. 7 is a diagram of part of the current processor and part of the memory controller used to read the memory cells.

FIG. 7 shows some of the circuitry for implementing that part of the Current Processor 50 associated with the cell reading sequence. Similar circuitry can be used for implementing the Current Processor 50 components shown in FIGS. 8 and 9. An Averaging Circuit 50A is provided which includes a P channel device 54 having a gate which receives voltage Vtp from the Programmed Cell Reference 44. Transistor 48 associated with the Programmed-Cell Reference 44 (FIG. 6) and transistor 54 function together as a current mirror so that the current through transistor 54 is indicative of the programmed threshold voltage VtWrite of the programmed reference cell 10a connected to word line WL0.

Transistor 48 associated with the Erased-Cell Reference 46 operates in conjunction with transistor 56 so as to form a current mirror so that the current in transistor 56 is indicative of the erased threshold voltage VtErase of cell 10b connected to word line WL0. The two currents are summed in N channel transistor 58. Transistor 58 operates in conjunction with transistor 62 to form a further current mirror. However, the transistor 62 is implemented to have a width/length ratio of one/half of that of transistor 58 so that the current in 62 will be half that of the sum current in transistor 58.

The N channel transistor 64 conduct all of the current of transistor 62 and has the same geometry as that of transistors 48. Thus, the voltage Vref on line 65 will be equal to one half the sum of voltages Vtp and Vte. Controller 52 includes a Comparator Circuit 52a for comparing the voltage Vr read from selected cell 10 of the array 42a with the computed reference voltage Vref. N channel transistors 84 and 66 form a differential pair, with the gate of transistor 84 receiving the reference voltage Vref and the gate of transistor 66 receiving the read voltage Vr. P channel transistors form a current mirror load for the differential transistor pair 84/66.

The output of the comparator circuit on line 72 is coupled to an inverter circuit comprised of transistors 74 and 76. The inverter circuit functions to convert the comparator output to a digital level Read Voltage signal which is indicative of the state of the cell 10 being read.

It can be seen that by adaptively controlling the programming and the erasing of cells 10 of the memory array 42 in the manner described it is possible to accurately control the actual erased and programmed threshold voltages of the array. The difference in the erased and programmed threshold voltages is controlled to compensate for "weak" and "strong" cells. This feature provides for fast cell reads since large magnitude voltage swings of the read voltage Vr for programmed and unprogrammed cells are eliminated. In addition, the reference voltage Vref is also adaptively controlled so that the voltage Vref will fall very close to midway between the erased and programmed threshold voltages. This provides for reliable cell reading, even though the cell erased and programmed threshold voltages have been adjusted to be relatively close to one another.

Thus, fast and reliable memory operations, even under low voltage operating conditions, are achieved by virtue of the present invention. While one embodiment of the invention has been described in some detail, it is to be understood that those skilled in the art can make changes without departing from the spirit and scope of the invention as defined by the appended claims. By way of example, the manner in which the cells are adaptively programmed and erased may take into account factors other than the strength of the cells. During fabrication of the cells, an ion implant is used to set the threshold voltage Vt of the cells. However, the threshold voltage Vt can typically vary from +1.5 to +2.5 volts. This will affect the programming and erasing characteristics of the cells, but will have little effect on the final strength of the cells. Adaptive programming and erasing can assist in compensating for such process related variations.

I claim:

1. A flash memory system comprising:

a row of data flash memory cells formed in an integrated circuit;

a programmed flash memory cell formed in the integrated circuit having a programmed threshold voltage;

an erased flash memory cell formed in the integrated circuit having an erased threshold voltage;

control means for programming, erasing and reading the data cells, the control means including:
(a) program reference means for determining the programmed threshold voltage of the programmed flash memory cell;
(b) erase reference means for determining the erased threshold voltage of the erased flash memory cell;
(c) reference means for determining a reference voltage in response to the programmed threshold voltage and the erased threshold voltage;
(d) reading means for reading a data flash memory cell to determine a data cell voltage, the data cell voltage indicating a state of the data flash memory cell; and
(e) comparing means for comparing the data cell voltage to the reference voltage to determine whether the data flash memory cell is programmed.

2. The memory system of claim 1 wherein the reference voltage is approximately equal to one half the sum of the programmed threshold voltage and the erased threshold voltage.

3. The memory system of claim 2 wherein the programmed flash memory cell and the erased flash memory cell are arranged as part of the row of data cells.

4. The memory system of claim 3 wherein the memory system includes a plurality of rows of flash memory cells that each include data flash memory cells, a programmed flash memory cell, and an erased flash memory cell.

5. The memory system of claim 1 wherein the control means further comprises erasing means for erasing the data cells, wherein the erasing means includes:
pulse means for applying a plurality of erase voltage pulses to the data cells, each erase voltage pulse having a magnitude and duration; and
adjusting means for adjusting the magnitude and duration of an erase voltage pulse when the threshold voltage of a data cell is greater than a predefined threshold voltage after a predetermined number of erase voltage pulses have been applied.

6. The memory system of claim 5 wherein the magnitude and duration of the erase voltage pulse is adjusted in response to a difference between the programmed threshold voltage and the erased threshold voltage.

7. The memory system of claim 1 wherein the control means further comprises programming means for programming the data cells, wherein the programming means includes:
pulse means for applying a plurality of programming voltage pulses to the data cells, each programming voltage pulse having a magnitude and duration; and
adjusting means for adjusting the magnitude and duration of a programming voltage pulse when the threshold voltage of a data cell is less than a predefined threshold voltage after a predetermined number of programming voltage pulses have been applied.

8. The memory system of claim 7 wherein the magnitude and duration of the programming voltage pulse is adjusted in response to a difference between the programmed threshold voltage and the erased threshold voltage.

9. A flash memory system comprising:

a row of data flash memory cells formed in an integrated circuit;

a programmed flash memory cell formed in the integrated circuit having a first value;

an erased flash memory cell formed in the integrated circuit having a second value;

control means for programming, erasing and reading the data cells, the control means including:
(a) program reference means for determining the first value of the programmed flash memory cell;
(b) erase reference means for determining the second value of the erased flash memory cell;
(c) reference means for determining a reference value in response to the first and second values;
(d) reading means for reading a data flash memory cell to determine a data cell value, the data cell value indicating a state of the data flash memory cell; and
(e) comparing means for comparing the data cell value to the reference value to determine whether the data flash memory cell is programmed.

10. The memory system of claim 9 wherein the first value includes the threshold voltage of the programmed flash memory cell.

11. The memory system of claim 9 wherein the second value includes the threshold voltage of the erased flash memory cell.

12. A flash memory system comprising:

a row of data flash memory cells formed in an integrated circuit;

a programmed flash memory cell formed in the integrated circuit having a programmed threshold voltage;

an erased flash memory cell formed in the integrated circuit having an erased threshold voltage;

control means for programming, erasing and reading the data cells, the control means including:
(a) program reference means for determining the programmed threshold voltage of the programmed flash memory cell;
(b) erase reference means for determining the erased threshold voltage of the erased flash memory cell; and
(c) programming means for programming the data cells, wherein the programming means includes:
pulse means for applying a plurality of programming voltage pulses to the data cells, each programming voltage pulse having a magnitude and duration; and
adjusting means for adjusting the magnitude and duration of a programming voltage pulse when the threshold voltage of a data cell is less than a predefined threshold voltage after a predetermined number of programming voltage pulses have been applied,
wherein the magnitude and duration of the programming voltage pulse is adjusted in response to a difference between the programmed threshold voltage and the erased threshold voltage.

13. A flash memory system comprising:

a row of data flash memory cells formed in an integrated circuit;

a programmed flash memory cell formed in the integrated circuit having a programmed threshold voltage;

an erased flash memory cell formed in the integrated circuit having an erased threshold voltage;

control means for programming, erasing and reading the data cells, the control means including:
(a) program reference means for determining the programmed threshold voltage of the programmed flash memory cell;
(b) erase reference means for determining the erased threshold voltage of the erased flash memory cell; and
(c) erasing means for erasing the data cells, wherein the erasing means includes:

pulse means for applying a plurality of erase voltage pulses to the data cells, each erase voltage pulse having a magnitude and duration; and adjusting means for adjusting the magnitude and duration of an erase voltage pulse when the threshold voltage of a data cell is greater than a predefined threshold voltage after a predetermined number of erase voltage pulses have been applied, wherein the magnitude and duration of the erase voltage pulse is adjusted in response to a difference between the programmed threshold voltage and the erased threshold voltage.

14. A method of controlling a memory system which includes a row of data flash memory cells, a programmed flash memory cell, and an erased flash memory cell, the programmed flash memory cell having a programmed threshold voltage, the erased flash memory cell having an erased threshold voltage, the method comprising the steps of:

determining the programmed threshold voltage of the programmed flash memory cell;

determining the erased threshold voltage of the erased flash memory cell;

determining a reference voltage in response to the programmed threshold voltage and the erased threshold voltage;

reading a data cell so as to produce a read voltage; and determining whether the read cell was in a programmed state by comparing the read voltage with the reference voltage.

15. The method of claim 14 wherein the step of determining the programmed threshold voltage includes the steps of programming the programmed flash memory cell separate from the data cells, and reading the programmed flash memory cells.

16. The method of claim 14 wherein the step of determining the erased threshold voltage includes the steps of erasing the erased flash memory cell separate from the data cells, and reading the programmed flash memory cells.

17. A method of controlling a memory system which includes a row of data flash memory cells, a programmed flash memory cell, and an erased flash memory cell, the programmed flash memory cell having a programmed threshold voltage, the erased flash memory cell having an erased threshold voltage, the method comprising the steps of:

determining the programmed threshold voltage of the programmed flash memory cell;

determining the erased threshold voltage of the erased flash memory cell;

programming the data cells, wherein the programming step includes:

applying a plurality of programming voltage pulses to the data cells, each programming voltage pulse having a magnitude and duration; and adjusting the magnitude and duration of a programming voltage pulse when the threshold voltage of a data cell is less than a predefined threshold voltage after a predetermined number of programming voltage pulses have been applied, wherein the magnitude and duration of the programming voltage pulse is adjusted in response to a difference between the programmed threshold voltage and the erased threshold voltage.

18. A method of controlling a memory system which includes a row of data flash memory cells, a programmed flash memory cell, and an erased flash memory cell, the programmed flash memory cell having a programmed threshold voltage, the erased flash memory cell having an erased threshold voltage, the method comprising the steps of:

determining the programmed threshold voltage of the programmed flash memory cell;

determining the erased threshold voltage of the erased flash memory cell;

erasing the data cells, wherein the erasing step includes:

applying a plurality of erase voltage pulses to the data cells, each erase voltage pulse having a magnitude and duration; and adjusting the magnitude and duration of an erase voltage pulse when the threshold voltage of a data cell is greater than a predefined threshold voltage after a predetermined number of erase voltage pulses have been applied, wherein the magnitude and duration of the erase voltage pulse is adjusted in response to a difference between the programmed threshold voltage and the erased threshold voltage.

* * * * *